United States Patent [19]

Makowiecki et al.

[11] Patent Number: 5,766,747
[45] Date of Patent: Jun. 16, 1998

[54] MAGNETRON SPUTTERED BORON FILMS

[75] Inventors: Daniel M. Makowiecki; Alan F. Jankowski, both of Livermore, Calif.

[73] Assignee: Regents of the University of California, Oakland, Calif.

[21] Appl. No.: 334,090

[22] Filed: Nov. 4, 1994

Related U.S. Application Data

[60] Continuation-in-part of Ser. No. 48,373, Apr. 15, 1993, Pat. No. 5,389,445, which is a division of Ser. No. 666,971, Mar. 11, 1991, Pat. No. 5,203,977.

[51] Int. Cl.$^6$ .................................................. B32B 9/04
[52] U.S. Cl. .................. 428/220; 428/336; 428/457; 428/704
[58] Field of Search .................. 428/457, 336, 428/469, 688, 689, 704, 912.2, 606, 220; 359/584, 585, 589; 148/DIG. 1; 204/157.45, 192.25, 192.28, 192.26, 192.27, 192.15; 427/248.1, 250, 523, 530, 531, 566, 590, 593

[56] References Cited

U.S. PATENT DOCUMENTS

| 3,488,152 | 1/1970 | Kuehl | 423/298 |
|---|---|---|---|
| 3,677,799 | 7/1972 | Hou | 423/298 |
| 4,177,474 | 12/1979 | Ovshinsky | 357/2 |
| 4,342,734 | 8/1982 | Kumar | 423/298 |
| 5,183,777 | 2/1993 | Doki | 437/160 |
| 5,203,977 | 4/1993 | Makowiecke | 204/192.15 |
| 5,389,445 | 2/1995 | Makowiecki | 428/457 |

FOREIGN PATENT DOCUMENTS

| 33879 | 3/1979 | Japan | 423/298 |
|---|---|---|---|

OTHER PUBLICATIONS

Labou, S., Applied Optics, 24, 576 (1985).
SPIE vol. 984, Manufacture, Structure and Performance of W/B$_4$C Multilayer X-Ray Mirrors, A.F. Jankowski et al., pp. 64–74, 1988.
J. Vac. Sci. Technol. A8(6), Magnetron Sputtered Boron Films and Ti/B Multilayer Structures, D.M. Makowiecki et al., pp. 3910–3913, Nov./Dec. 1990.
7th CIMTEC, Densification Studies of Refractory Materials Using Hot Isostatic Pressing (HIP) And Tantalum Containment, C. Hoenig et al., pp. 1337–1345, Jun. 1990.
UCRL–JC–106571, Magnetron Sputter Deposition of Boron And Boron Carbide, M. McKernan et al., Apr. 1991.

*Primary Examiner*—Timothy Speer
*Attorney, Agent, or Firm*—L. E. Carnahan; Henry P. Sartorio

[57] ABSTRACT

A method is described for the production of thin boron and titanium/boron films by magnetron sputter deposition. The amorphous boron films contain no morphological growth features, unlike those found when thin films are prepared by various physical vapor deposition processes. Magnetron sputter deposition method requires the use of a high density crystalline boron sputter target which is prepared by hot isostatic pressing. Thin boron films prepared by this method are useful for producing hardened surfaces, surfacing machine tools, etc. and for ultra-thin band pass filters as well as the low Z element in low Z/high Z optical components, such as mirrors which enhance reflectivity from grazing to normal incidence.

10 Claims, 5 Drawing Sheets

30 μm 1.00 μm 5,766,747

MAGNETRON SPUTTERED BORON FILMS

RELATED APPLICATIONS

This application is a continuation-in-part of U.S. application Ser. No. 08/048,373, filed Apr. 15, 1993, now U.S. Pat. No. 5,389,445, issued Feb. 14, 1995, which is a division of U.S. application Ser. No. 07/666,971, filed Mar. 11, 1991, now U.S. Pat. No. 5,203,977 issued Apr. 20, 1993.

The United States Government has rights in this invention pursuant to Contract No. W-7405-ENG-48 between the United States Department of Energy and the University of California for the operation of Lawrence Livermore National Laboratory.

FIELD OF THE INVENTION

The invention is related generally to thin films of low density materials and more particularly to thin films of amorphous boron, which can be used as a hard surface material or can be layered with other materials for use in optical coatings or as a hardening material, for example.

BACKGROUND OF THE INVENTION

Thin foils and thin films are widely used as band-pass filters, in transmission filters, and in spectroscopic applications which use irradiation wavelengths in the range of extreme ultra-violet to soft x-rays. Thin foils and thin films of boron are also desirable for use to increase the hardness of a surface or of a material. Submicron foils, 0.1–0.2 μm thick, have been produced in various low Z materials (low atomic number) (i.e. carbon, beryllium) by sputtering and evaporation processes. Boron films, however, have been produced by resistance heating or electron beam evaporation (Labov, S. et al., Applied Optics 24: 576 (1985)). Previous efforts to prepare boron foils by sputter deposition were precluded by the non-availability of dense, high purity sputter targets. Typically sputtered films exhibit superior mechanical properties and are preferred because they have fewer defects and finer morphological growth features than foils or films prepared by evaporative processes.

Multilayered coatings, which are used as reflective layers in x-ray optics, are typically tens to hundreds of angstroms thick. A multilayer x-ray mirror is the analog of a quarter-wave stack reflective coating with the added complication of radiation absorption in the layers. Physically, it is an alternating sequence of thin films of highly absorbing and less absorbing materials deposited on an optically smooth substrate. The layered structure is periodic and results in a large angle, resonant reflectivity which is three or four orders of magnitude greater than the simple Fresnel reflection from an unlayered surface. Reflectivity in a multilayer mirror derives from the interference of x-rays coherently scattered from the interfaces between materials of higher or lower x-ray absorption.

The quality of the multilayered optical coating is determined by the perfection of the interfaces between the layers and the uniformity of the layer dimensions. Standard methods for application of multilayer coatings use the physical vapor deposition (PVD) process of evaporation or sputtering.

The coarse layer microstructure produced and the inherent difficulty in controlling the evaporation processes adversely effects the interface perfection and layer dimensional stability, and consequently, the efficiency of the optical coating produced by such methods. The use of computer controlled sputtering processes allows the production of complex multilayer coatings with variable layer thickness and composition.

SUMMARY OF THE INVENTION

Accordingly, it is an object of the invention to provide thin, amorphous boron films which have no morphological growth features.

It is a further object of the invention to provide thin multilayer structures which utilize thin boron films.

It is another object of the invention to provide multilayer structures which comprise thin boron films with high Z metal interlayers.

It is another object of the invention to provide a material of increased hardness using thin boron films.

The invention provides thin boron foils which do not include any morphological growth features such as columnar boundaries. These ultra-thin films can be produced as free-standing filters which do not require a protective or supportive layer, such as carbon-hydrogen based polymer films, which would reduce or contaminate the transmitted radiant energy intensity. Also, the ultra-thin boron films can be deposited on materials such as used in various types of tools to increase the hardness and thus increase the wear resistance of such tool materials.

A foil is a very thin sheet of metal, which is usually not thicker than 0.15 mm. A thin film is a material which may be on a substrate, with a thickness not greater than 10 μm and uniformity within 20% of its average value. In the instant application, the terms thin film of metal, or thin film and the term foil will be used interchangeably to represent one layer of a particular metal which may be selected from a range of metal thicknesses. In the instant application, low Z refers to metals with an atomic number of 20 or less, and high Z refers to any metal or a group of metals with an atomic number greater than 20, which includes transition metals, refractory metals, or noble metals.

The stability of the amorphous sputter-deposited boron suffices for the formation of layered structures even in reactive and energetic binary systems. With the use of these thin boron layers as the non-absorbing low Z (low atomic number) layer in high Z/low Z multilayer structures, it is possible to further reduce the absorption of such structures below that which is attainable with other low Z layers, such as carbon or boron carbide ($B_4C$) layers. This thin boron layer fabrication technique is applicable to the production of multilayer components, such as mirrors, for use with a wide range of optical wavelengths, and well as the production of hardened materials.

The fabrication of boron foils, films and multilayered structures has, previously, not been possible because of the problem of securing sufficiently dense, high purity boron to serve as a target for sputter deposition. A suitable target is now available as a high density, crystalline boron prepared by a method described by Hoenig et al. in Proceedings of the Seventh CIMTEC World Ceramics Congress, Montecatini-Terme, Italy, Jun. 24–28, 1990, published by Elsevier, The Netherlands, which is incorporated by reference. With this high density target material, it is possible to adequately control the sputtering process so that uniform thin amorphous boron foils, films and multilayer structures, can be produced.

DETAILED DESCRIPTION OF THE INVENTION

Figure 1:
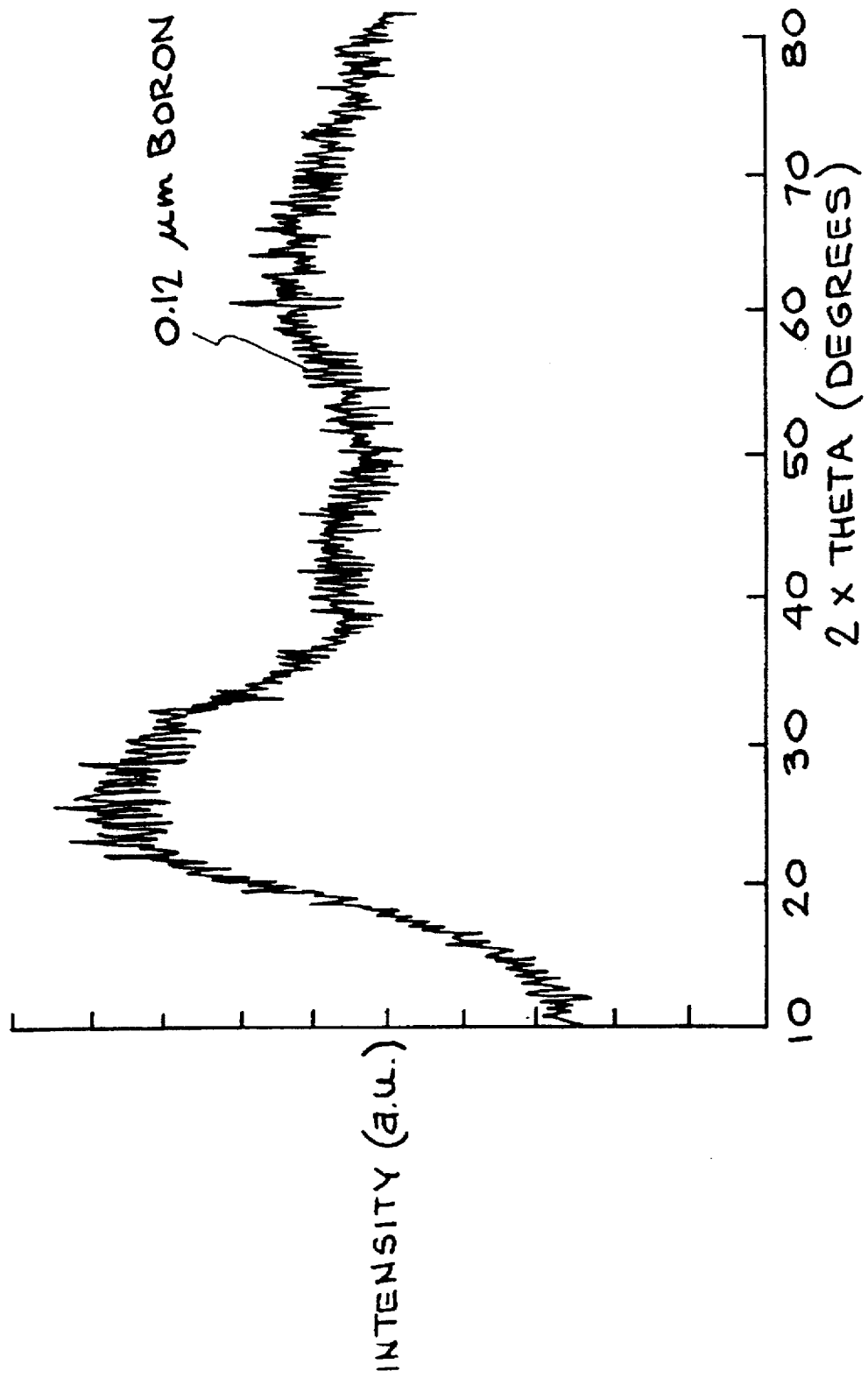
FIG. 1 is an x-ray diffraction scan ($CuK_\alpha$ high angle $\theta/2\theta$ scan) of a 0.12 μm-thick sputter deposited boron foil which lacks any evidence of crystallinity.

The invention is directed to thin, amorphous boron films and the thin amorphous layers and a method for producing same. Quality thin films are produced by a sputtering process which uses dense boron sputtering targets, particularly high density, crystalline boron sputtering targets, which are available through a hot isostatic pressing technique. The sputtering occurs by the attraction of ions created by electrons trapped in the magnetic field of the magnetron sputter source to the dense target material. Multilayer structures, for use as mirrors and machine tools, may be fabricated by the use of a multihead magnetron sputter system in which all process parameters are controlled through active feedback. For mirror formation, for example, the mounted low Z and high Z targets undergo rotation during the sputter deposition process to ensure development of uniform layers.

The magnetron sputter deposition process is performed in an evacuated chamber which is cryogenically pumped to a base pressure of about $10^{-5}$–$10^{-6}$ Pa. In the preferred mode, a base pressure of $6.7 \times 10^{-6}$ Pa is selected. To initiate the sputtering process, the atmosphere of the reaction chamber is filled with an inert gas, including but not limited to argon, helium, neon, krypton, and xenon. In the preferred mode argon gas is used, at a working pressure of about $6.7 \times 10^{-1}$ Pa. The magnetron sputtering source is run in the rf (radio frequency) mode, because the high density boron is an electrical insulator. The substrate, which is to receive the thin film is held at room temperature and is positioned directly above the magnetron sputtering source. The deposition process is similar to that described in Makowiecki, D. M. et al. in J. Vacuum Science Technology A 8(6): 3910–3913 (1990), which is incorporated by reference.

Previous attempts to use boron in a sputtering deposition process were limited by the non-availability of boron substrates which could be found only in powders or in thin layers. The pure dense boron sputtering targets were fabricated by a hot isostatic pressing technique such as that described in the previously cited Hoenig et al. reference. Briefly, pure boron powder (99.9%) was vacuum sealed in a tantalum can by electron beam welding and then hot isostatically compacted at a temperature of 1700° C. and a pressure of 0.21 GPa argon gas. After removal of the tantalum can, standard ceramic machining techniques used to fabricate sputtering targets from the monolithic piece of boron. The crystalline boron product has a near theoretical density (2.36 g/cc) and an isotropically uniform microstructure. The high density crystalline rhombohedral boron target used in carrying out this invention has a bulk density greater than 2.22 g/cc, preferably about 2.34 g/cc, and a porosity <0.15%.

Thin boron films are sputtered onto any of a variety of substrates at room temperature. The receiving substrate can be any of a variety of quartz or glass substrates, including but not limited to NaCl-coated float glass, and various machine tool metals. The film produced has a thickness of less than 10 μm, preferably in the range of 1.0–2.0 μm.

A magnetron sputter deposition process used to fabricate the multilayer structures, was similar to that described in Jankowski, A. F. et al. in SPIE Conference Proceedings 984: 64–74 (1988), which is incorporated by reference. The deposition apparatus comprised a rotating carrousel of water-cooled substrates which passed sequentially over an array of sputtering target materials. The magnetron sources were arranged so that each layer deposition would be followed by an alternate layer material. The magnetron sputter guns, with the high Z materials operated in a DC mode using a solid-state power supply, about 1 to 10 Kw, and were arranged in a circular array beneath the substrate table. The substrate table was rotated, which provided continuous repeating movement of the substrates over the center of each magnetron gun. Typical rotation frequencies ranged from about 0.001 to 0.02 sec$^{-1}$. The sputter deposition rates were found to vary linearly with the power supplied to the magnetron gun.

Such a deposition apparatus is suitable for sputtering with a variety of high Z (Z of greater than 20) target materials including titanium and tin, as well as various refractory metals, noble metals, or transition metals, interspersed between dense low Z (Z of 20 or less) target materials, including, but not limited to, boron, beryllium, carbon, and boron carbide. The sputtering process takes place in an inert gas atmosphere, which could include helium, neon, krypton, xenon and argon, with argon preferred in particular. Cryogenic pumping was used to maintain the inert gas pressure in the range of about 2 to $15 \times 10^{-1}$ Pa. The receiving substrate was masked on an oxygen-free substrate table and kept at room temperature. The target to substrate distance was about 2–20 cm. The multilayer structures produced contained 50–100 layers with nominal repeat sequence of 7–10 μm.

The multilayered structures were characterized by several techniques, including x-ray diffraction (XRD), transmission electron microscopy (TEM), and Auger electron spectroscopy (AES).

The layer pair spacings of the multilayer structures were measured at grazing incidence using a standard powder diffractometer operated in the θ/2θ mode.

Electron diffraction provided complimentary information to that obtained via x-ray diffraction to determine the crystalline state of a thin film.

Atomic concentration profiles of the multilayers are measured with Auger electron spectroscopy (AES) profiling.

EXAMPLES

1. Formation Of Boron Films

A boron film of approximately 0.12 μm thickness, was produced by sputtering high density boron onto a NaCl-coated float glass substrate at room temperature. The coated glass substrate was prepared by thermally evaporating NaCl onto glass, which was precleaned using a detergent, deionized water and an alcohol rinse, and dried with argon gas. The substrate temperature for the NaCl evaporation was 23°

C. The high density crystalline boron target was rf magnetron sputtered at 400 watts in a 1.8 Pa argon atmosphere. The thin boron film was deposited at a rate of 0.1 nm/sec. when the target to substrate separation was 7 cm. The base pressure of the cryogenically pumped system after heating the interior to 80° C. for several hours was $5.3\times10^{-5}$ Pa.

2. Formation Of Ti/B Multilayers

A typical multilayer deposition system was used, for example, to make Ti/B multilayers. The magnetron sputtering target sources were arranged on the apparatus so that the deposition of a boron layer would be immediately followed by deposition of a titanium layer. The system base pressure was $1.3\times10^{-5}$ Pa, whereas the multilayer deposition used an argon gas pressure of 2.1 Pa. A rotating frequency of 0.17 rpm was used for the sequential deposition. The titanium and boron target sources were operated at 120–250 and 375–400 watts, respectively. The boron source was run in the rf mode, whereas the titanium source was run in the dc mode. The size of the Ti/B multilayers sputter deposited are listed on Table I. The physical thickness of the titanium and boron layers were determined by crystal monitor readings determined with diamond stylus profilometry.

TABLE I

Boron Foil and Ti/B Multilayer Dimensions

| Sample No. | No. of Layers | Layer Thickness Ti (nm) | Layer Thickness B (nm) |
| --- | --- | --- | --- |
| 1-89-08 | 64 | 2.9 | 5.8 |
| 1-89-09 | 100 | 6.6 | 3.5 |
| 1-89-17 | 100 | 4.6 | 8.4 |
| 1-89-16 | 20 | — | 6.2 |

3. X-ray Diffractive Character Of The Ti/B Multilayers

X-ray diffractive scans of the multilayer structures were typified by a nominal 8.7 nm repeat period of the Ti/B multilayer, for sample #1-89-08, which is shown in Table I. Five orders of reflection at grazing incidence were detected using a 40 KV, 40 mA beam. The repeat periods measured, corresponding to each order of reflection, n, (uncorrected for refraction) are listed in Table II. The number of reflections decreases as the titanium layer thickness increases. The measurements of the layer pair spacings are consistent with the deposition thickness parameters of Table I.

TABLE II

Measured Ti/B Layer Pair Spacings $d_n$ (nm)

| | n = | | | | |
| --- | --- | --- | --- | --- | --- |
| Sample No. | 1 | 2 | 3 | 4 | 5 |
| 1-89-08 | 78.6 | 86.4 | 85.9 | 86.8 | 86.2 |
| 1-89-09 | 88.4 | | | | |
| 1-89-17 | 98.1 | 110.0 | | | |

When the Ti/B multilayer structures with titanium layers greater than 4 nm thick were examined for the extent of crystallization with a high angle lens, there was some suggestion of microcrystalline titanium. The diffuse peak corresponding to a 0.228 nm planar spacing coincides with the high temperature beta phase of titanium in its closest packed orientation [(110)bbc]. No evidence of crystallization was evident for the boron layers or for the 0.12 μm thick boron foil, as shown in the diffraction scan of FIG. 1.

4. Transmission Electron Microscopy

Figure 2A:
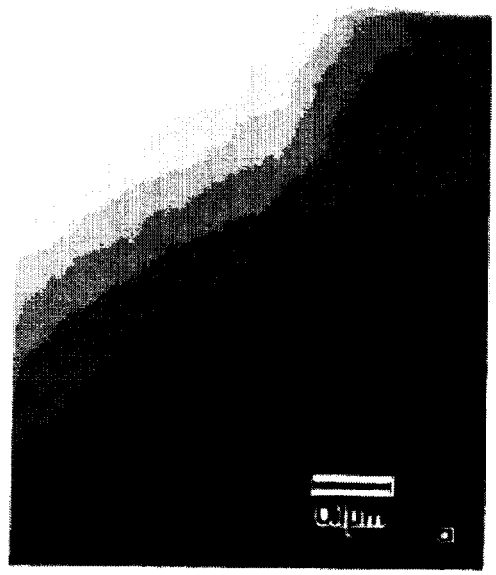
FIGS. 2A and 2B are transmission electron microscopy (TEM) images of 0.12 μm thick boron foil which shows lack of any growth morphology (e.g. columnar grains) or crystallinity in bright field (FIG. 2a) or dark field (FIG. 2b) images.
Figure 2B:
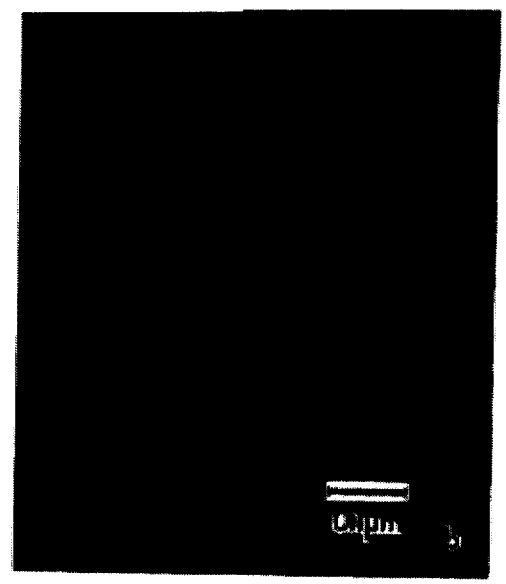
Figure 3A:
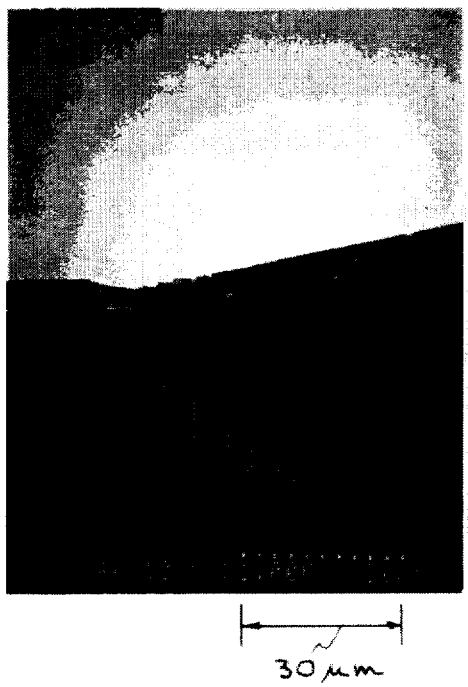
FIG. 3A is a scanning electron microscopy (SEM) image of a fractured boron film 6.8 μm thick.
Figure 3B:
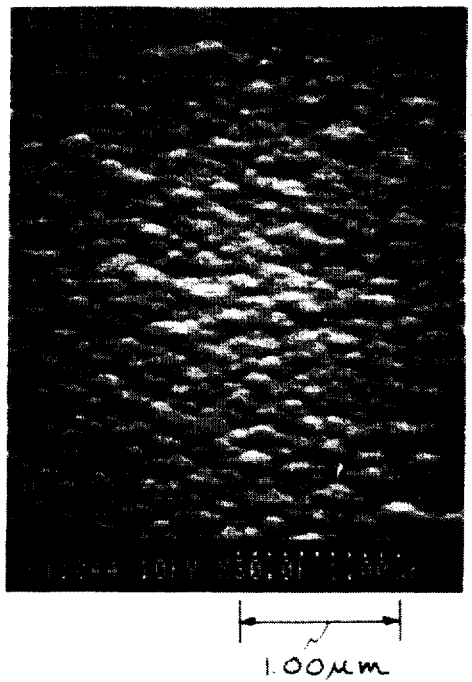
FIG. 3B shows the surface morphology of the dense boron film.

The plane surface of the 0.12 μm thick boron foil was examined by transmission electron microscopy in plane view in both bright-field (BF) and dark-field images (FIGS. 2a and 2b). There was no evidence of growth morphology such as columnar grains or crystallinity. Also, scanning electron microscopy (SEM) of a fractured boron film 6.8 μm thick was made (FIG. 3a), wherein the film as shown in FIG. 3b appears dense and has a slight rough appearing surface and a submicron columnar morphology.

Figure 4:
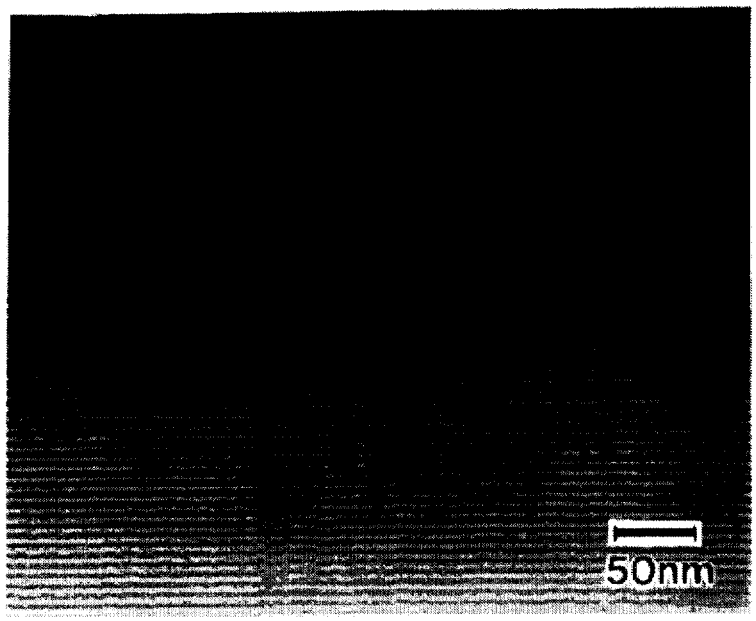
FIG. 4 is a transmission electron microscopy (TEM) bright-field image of a cross-section of the 8.7 nm Ti/B multilayer. The dark bands are titanium layers.
Figure 5:
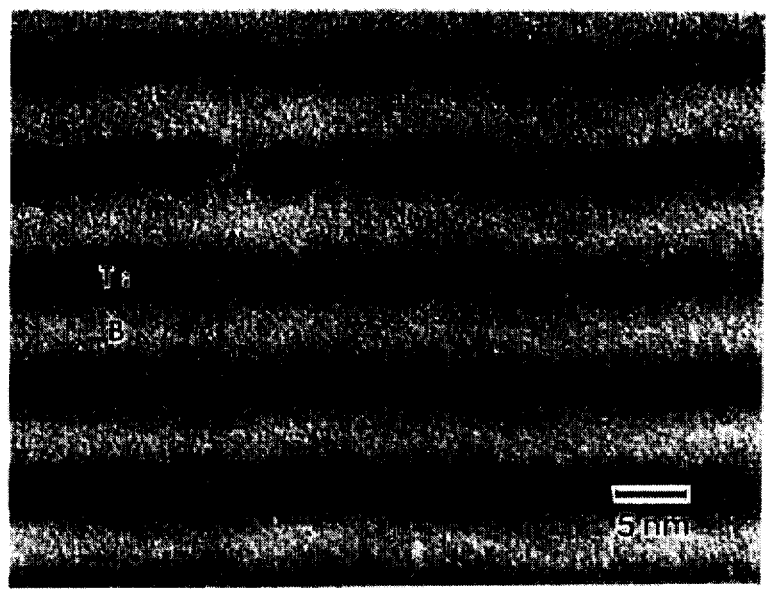
FIG. 5 is a high resolution electron micrograph of the multilayer structure of FIG. 4, showing the amorphous nature of the titanium and boron layers.

Microscopy of the cross-sections of Ti/B multilayers, by standard techniques, reveals the growth morphology of the sputtered deposits. The multilayers are characterized by a dense columnar structure, wherein the layers are continuous from one columnar grain to the next. This structure is shown in the TEM bright field image of the 8.7 nm Ti/B multilayer of sample #1-89-08 in FIG. 4. High resolution imaging discloses the extent of the microcrystallinity as well as the interface interaction. The titanium and boron layers are completely amorphous, as is demonstrated in FIG. 5, which is a high resolution micrograph of the structure of the multilayer of FIG. 4. The Ti-B and B-Ti interfaces appear identical with an approximate roughness of less than 0.7 nm.

5. Auger Electron Spectroscopy

Figure 6:
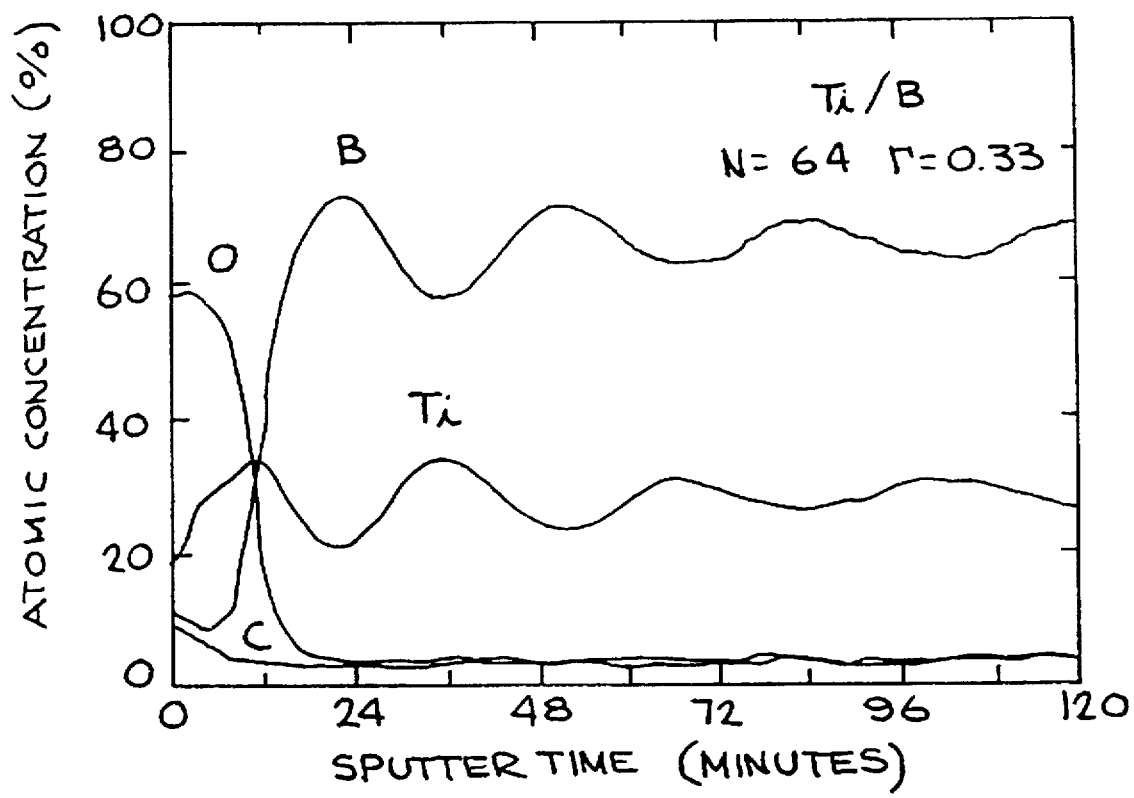
FIG. 6 is an atomic concentration profile, by Auger Electron Spectroscopy (AES), of the titanium-boron multilayer structure shown in FIG. 4.

Using Auger electrons generated at 3 KeV, 10 μA electron beam, the atomic concentrations could be calculated from the 417 eV titanium peak, the 179 eV boron peak, the 272 eV carbon peak and the 503 eV oxygen peak. A 2 KeV 0.53 μA argon ion beam was used to sputter etch a 25 mm² area of the sample surface, at $4.0\times10^{-3}$ Pa, while the system base pressure was held below $6.6\times10^{-8}$ Pa. The surface carbon and oxygen contaminations are removed during the depth profile etching (FIG. 6). The titanium and boron concentrations rise and fall sequentially during sequential sputtering away of each layer. The average value for each component is in agreement with the multilayer dimensions shown in Table I.

6. Hardness Measurements

Microhardness measures were made on the 6.8 μm thick boron film (FIG. 3). These measurements were made with a Leco Model DM400 microhardness tester with a 50 gm load and at a 5 μm indent. Microhardness measured on the surface of boron films deposited on sapphire had an average Vickers microhardness value of 2900 Kgm/mm² on the surface and 4300 Kgm/mm² measured normal to the film growth direction using a 50 gm load and a 2.5 μm indentor. This data can be viewed as qualitative because of the thickness of the boron film relative to indentor depth.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A foil consisting of amorphous boron having a thickness of 0.12 μm to 10 μm and which has no morphological growth features.

2. The amorphous boron foil as in claim 1, with a thickness of 1.0 μm to 2.0 μm.

3. The amorphous boron foil as in claim 1, fabricated by a method comprising:

exposing a dense boron target to an rf magnetron sputtering source in an inert gas environment; and collecting a thin amorphous foil of ejected boron on a substrate.

4. The amorphous boron foil as in claim 3, wherein the substrate consists of a metal, and the foil of boron thereon increases wear resistance of the metal.

5. The amorphous boron foil as in claim 3, wherein said boron foil has a microhardness value in the range of about 2900 Kgm/mm$^2$ to about 4300 Kgm/mm$^2$.

6. A film consisting essentially of boron having a thickness of 0.12–10 μm and no morphological growth features, produced by:

subjecting a boron target having a density near theoretical density to an rf magnetron sputtering process in an atmosphere of inert gas selected from the group consisting of argon, helium, neon, krypton, and xenon; and depositing a film of boron on a surface.

7. The film of boron as set forth in claim 6, wherein said surface constitutes a metal, and said thin film constituting a hardened surface on said metal.

8. The film of boron as set forth in claim 7, wherein the hardened surface has a microhardness value of about 2900–4300 Kgm/mm$^2$.

9. A film consisting essentially of boron having a thickness of 0.12–10 μm and no morphological growth features, said film being located on at least one surface of a material for increasing the hardness of said material.

10. The film of claim 9, wherein the hardness has a value of about 2900–4300 Kgm/mm$^2$.

* * * * *